(12) United States Patent
Harrington et al.

(10) Patent No.: US 9,225,576 B1
(45) Date of Patent: Dec. 29, 2015

(54) RESILIENT CHANNEL AND BROADCAST MODULATION

(71) Applicants: Michael Harrington, Cork (IE); Frank O'Keeffe, Glounthaune (IE)

(72) Inventors: Michael Harrington, Cork (IE); Frank O'Keeffe, Glounthaune (IE)

(73) Assignee: ARRIS Enterprises, Inc., Suwanee, GA (US)

( * ) Notice: Subject to any disclaimer, the term of this patent is extended or adjusted under 35 U.S.C. 154(b) by 0 days.

(21) Appl. No.: 14/025,923

(22) Filed: Sep. 13, 2013

Related U.S. Application Data

(63) Continuation of application No. 13/109,360, filed on May 17, 2011, now Pat. No. 8,558,631.

(60) Provisional application No. 61/345,581, filed on May 17, 2010.

(51) Int. Cl.
*H04L 27/20* (2006.01)
*H04L 27/36* (2006.01)
*H03C 3/40* (2006.01)
*H04L 29/06* (2006.01)

(52) U.S. Cl.
CPC .......... *H04L 27/362* (2013.01); *H04L 27/2071* (2013.01); *H03C 3/40* (2013.01); *H04L 29/06027* (2013.01)

(58) Field of Classification Search
CPC .............. H04L 27/362; H04L 27/2071; H04L 29/06027; H03C 3/40
USPC .................................... 332/103; 370/352, 360
See application file for complete search history.

(56) References Cited

U.S. PATENT DOCUMENTS

| 5,534,941 | A | 7/1996 | Sie et al. |
| 5,535,191 | A | 7/1996 | Park |
| 5,894,249 | A | 4/1999 | Kuwabara |
| 8,558,631 | B1 * | 10/2013 | Harrington et al. ........... 332/103 |
| 2007/0076746 | A1 | 4/2007 | Faska et al. |
| 2008/0219385 | A1 | 9/2008 | Feher |
| 2009/0135948 | A1 * | 5/2009 | Kisovec et al. ............... 375/295 |
| 2010/0295628 | A1 * | 11/2010 | Lehtinen et al. .............. 332/144 |

* cited by examiner

*Primary Examiner* — Robert Pascal
*Assistant Examiner* — Richard Tan
(74) *Attorney, Agent, or Firm* — Susan R. Payne (57) ABSTRACT

Methods, systems, and apparatuses can provide a plurality of RF channels and outputs using digital modulation and combining. In various examples, generation of digital IQ packetized data in combination with digital switching can increase the number of RF modulated channels, optimize broadcast transmission and/or provide transmission resiliency.

9 Claims, 10 Drawing Sheets

RESILIENT CHANNEL AND BROADCAST MODULATION

RELATED APPLICATIONS

This application is a continuation of pending U.S. patent application Ser. No. 13/109,360, entitled "Improved Resilient Channel and Broadcast Modulation," filed on May 17, 2011, which is a non-provisional application claiming the benefit of U.S. Provisional Application Ser. No. 61/345,581, entitled "Improved Resilient Channel and Broadcast Modulation," filed on May 17, 2010, both of which are hereby incorporated by reference in their entireties.

TECHNICAL FIELD

This disclosure relates to the generation of digitally modulated radio frequency (RF) channels and outputs for resilient unicast and broadcast transmission.

BACKGROUND

There has been an industry trend from analog to digital modulation in communication systems. Some of the benefits of digital modulation include more robust communication, ability to introduce security through encryption/de-encryption, the ability to multiplex multiple forms of data (e.g., data, voice, video . . . ) and lower implementation costs, among others.

Digital modulation can be used to transfer digital serial data over an RF passband waveform. Modulation techniques include, but are not limited to, quadrature phase shift keying (QPSK), differential quadrature phase shift keying (DQPSK), frequency shift keying (FSK), minimum shift keying (MSK), quadrature amplitude modulation (QAM) and differential quadrature amplitude modulation (DQAM). Digital modulation is used in wireless and wired communication systems. Cellular, satellite, terrestrial and broadband cable systems represent examples of communication systems implementing digital modulation. Modulation can be implemented through IQ generation (e.g., channel coding) and digital modulation (e.g., RF synthesis or direct digital synthesis). The "I" represents the in phase component where the "Q" represents the quadrature component. IQ data can result in an IQ stream that can be switched to provide resiliency and support broadcast transmissions from a single generation point. In one implementation, IQ data can be packetized for switching while other implementations switching can be performed on non-packetized IQ data. One or more IQ streams can be combined in one implementation of a digital modulator to optimize the number of RF channels supported.

BRIEF DESCRIPTION OF THE DRAWINGS

Like reference numbers and designations in the various drawings indicate like elements.

DETAILED DESCRIPTION

Digitally modulated channels can be directly synthesized to an analog RF passband for transmission in a communication system. The number of digitally modulated channels can be limited by the digital modulation technology used in the implementation. To increase the number of modulated channels for transmission in a communication system one or more RF passbands can be combined in the analog domain. The communication system can be optimized through digitally combining modulated channels in the digital domain as opposed to the analog domain. The ability to reuse digital broadcast modulated channels can provide system optimization. Furthermore, resiliency to decrease communication service outages can further optimize a communication system.

Figure 1:
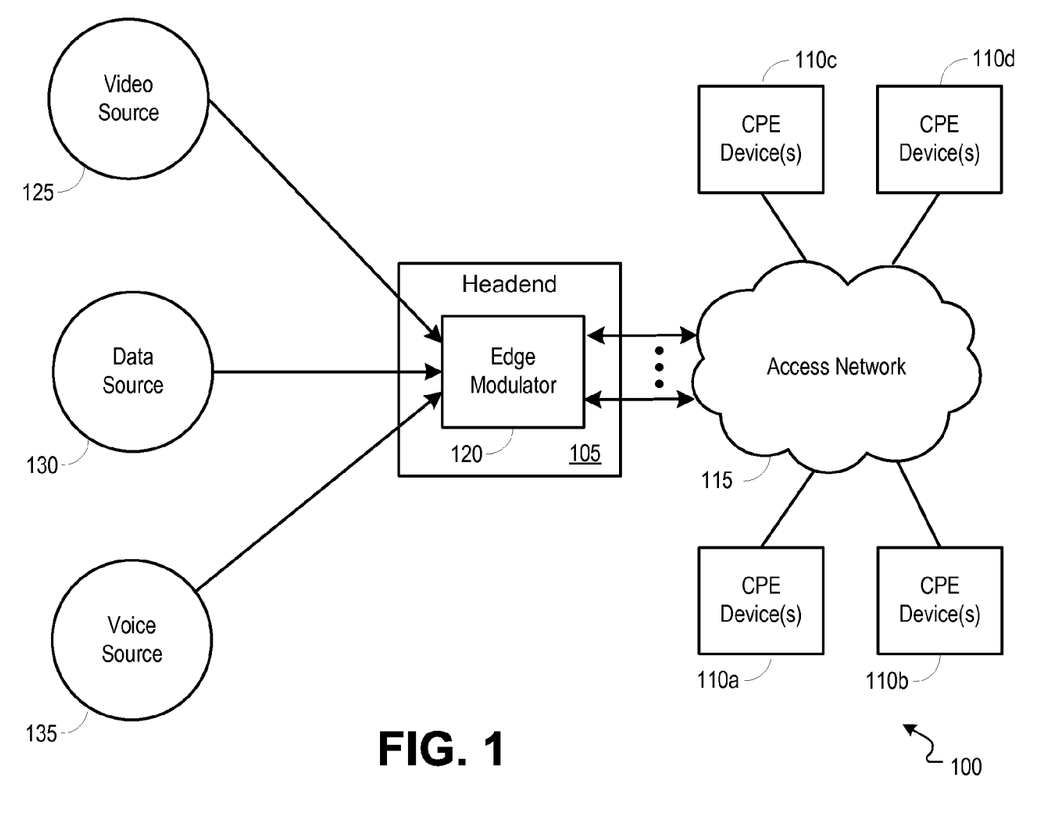
FIG. 1 is a block diagram illustrating an exemplary network environment operable to provide a plurality of RF modulated channels and outputs.

FIG. 1 is a block diagram illustrating an exemplary network environment operable to provide a plurality of RF modulated channels and outputs. In some implementations, a headend 105 can provide video, data and/or voice service(s) to customer premise equipment (CPE) devices 110a-d to one or more subscribers through access network 115. The headend 105 can include one or more devices such as edge modulator(s) 120. The edge modulator(s) 120 can operate to facilitate transmission of signals from digital video source(s) 125, data source(s) 130 and voice source(s) 135 through access network 115 to CPE devices 110a-d. In various implementations, digital video source(s) 125, data source(s) 130 and voice source(s) 135 can provide communications through one or more networks internal to the headend and/or one or more networks external to the headend (e.g., one or more extranets, the Internet, etc.). For simplicity, only communication from the sources 125, 130 and 135 will be described. It should be understood that communication with CPE devices 110 a-d can occur in both directions.

The edge modulator(s) 120 can receive data signals from digital video source(s) 125. Video source(s), for example, can provide MPEG transport streams generated by video streaming applications (e.g., Video on Demand). The edge modulator(s) 120 can receive data signals from data source(s) 130 or network nodes (not shown) in packet form. Voice source(s) can include VoIP data and can be provided to edge modulator(s) 120 from a public switched telephone network (PSTN) (not shown). Video, data and voice data sources 125, 130 and 135 can operate, for example, using Gigabit and/or 10 Gigabit ethernet protocols, sending data packets to edge modulator(s) 120. The video source(s) 125, data source(s) 130 and voice source(s) 135, can be packets from a CMTS (not shown).

In some implementations, the edge modulator 120 can modulate digital signals and generate one or more channels on one or more RF outputs for transmission to subscribers.

The RF output(s) can include, but are not limited to, data, voice and video streams for transmission to a combiner (not shown), which can combine multiple RF outputs onto coax, optical fiber, wireless or other physical layers for transmission to one or more CPE devices 110a-d via the access network 115.

CPE devices 110a-d can include, display and input/output devices such as televisions, personal computers (PC), video cameras, security systems and mobile phones. The interface to access network 115 can be integrated into CPE devices 110a-d or can be provided by separate device(s).

Figure 2:
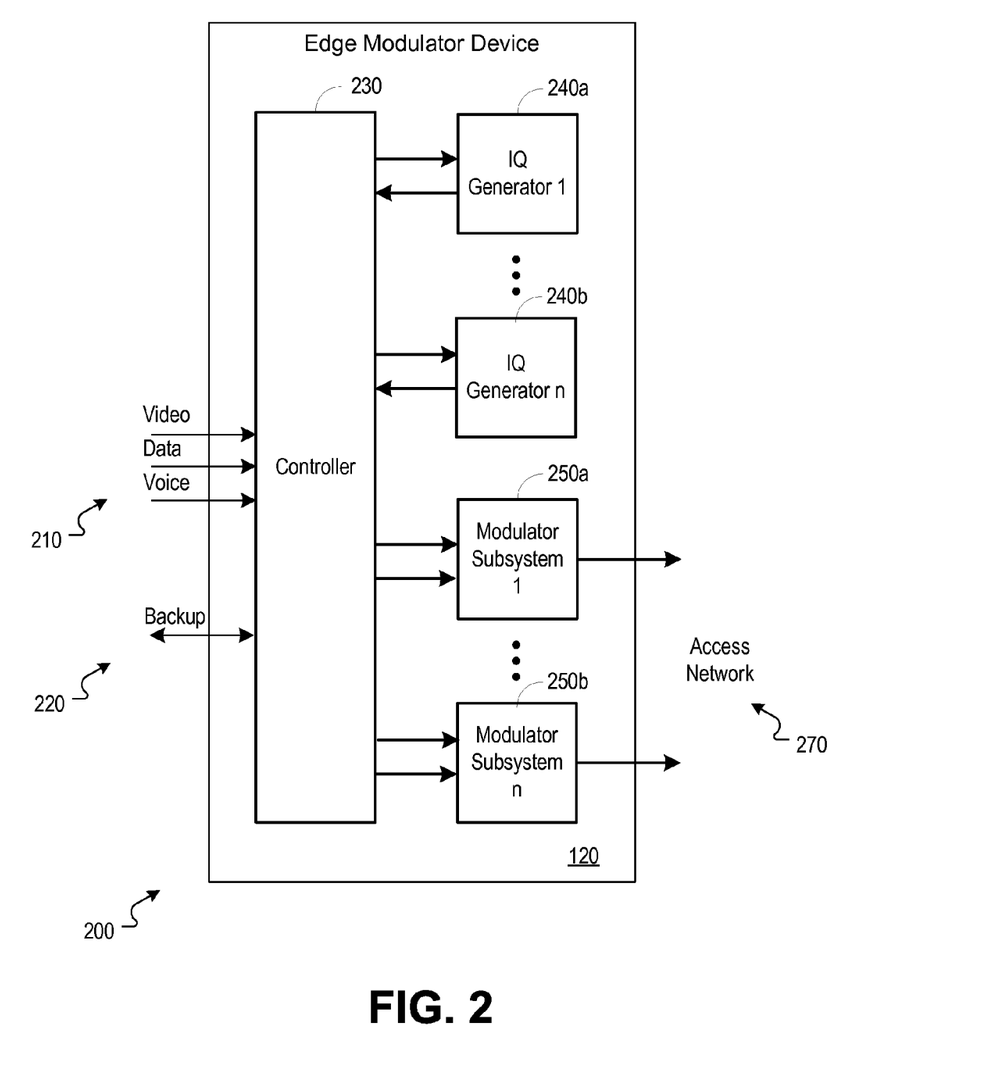
FIG. 2 is a block diagram illustrating one implementation of an edge modulator device.

FIG. 2 is a block diagram illustrating one implementation of an edge modulator device 120. The edge modulator device 120 and/or elements provided within the edge modulator device 120 can be used in wired or wireless communication systems. The edge modulator 120 can reside in a headend (e.g., headend 105 of FIG. 1), wireless base station, and/or can be distributed elsewhere in the communication system. Some implementations can include an edge modulator device 120, and/or elements of, in a fiber node (not shown) of an HFC network (e.g., access network 115 of FIG. 1).

The edge modulator device 120 can include one or more packet based interface(s) 210 and can receive data, voice and video packet based data streams. Some implementations can include the data, voice and video packets combined in one or more physical interface(s) 210. The packet interface(s) 210 can be provided by gigabit Ethernet or other interfaces such as 10-gigabit and passive optical network technologies. Implementations of the packet based interface(s) 210 can be copper or fiber based. The edge modulator device 120 can include one or more packet based backup interfaces(s) 220 providing resiliency in the event of a failure. The edge modulator device 120 can provide one or more RF output(s) 270. Each RF output can contain one or more modulated channels for transmission on the access network.

The controller 230 can be operable to implement the components of the packet interface(s) 210 which can include physical, link, network, transport and application layer components. Support of network, transport and application layer components can be involved in network management. For example, SNMP based network management of the edge modulator 120 can be implemented. The edge modulator 120 can also include one or more IQ generators 240a-b and modulator subsystems 250a-b.

The IQ generators 240a-b can be operable to receive video, data and voice information from controller 230 and perform a digital process of IQ generation (e.g, channel coding). Multiple modulation types can be implemented by IQ generators 240a-b to include, for example, quadrature phase shift keying (QPSK), differential quadrature phase shift keying (DQPSK), frequency shift keying (FSK), minimum shift keying (MSK), quadrature amplitude modulation (QAM) and differential quadrature amplitude modulation (DQAM), among any other suitable modulation scheme. IQ generators 240a-b can encapsulate the IQ components in a digital packet stream to be provided to controller 230. In other implementations (not shown) IQ generators 240a-b can provide an IQ stream to controller 230 in a non-packetized form.

The modulator subsystems 250a-250b can be operable to receive video, data, voice and IQ data from controller 230 generating a modulated signal (270) for transmission on access network (e.g., access network 115 of FIG. 1). In one implementation, IQ data can be encapsulated in a packet. In other implementation the IQ data can be non-packetized.

Figure 3:
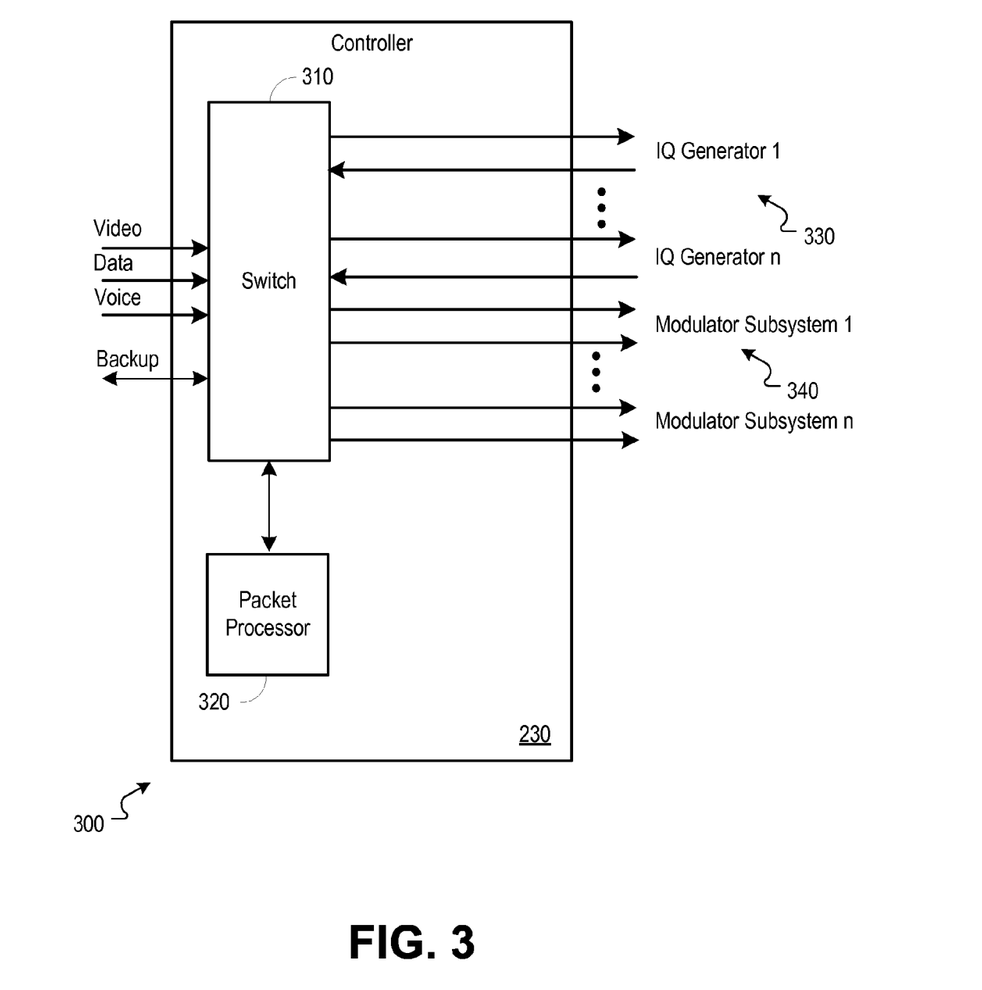
FIG. 3 is a block diagram illustrating one implementation of a controller device for use in an edge modulator.

FIG. 3 is a block diagram illustrating one implementation of a controller device for use in an edge modulator. The controller 230 can include switch 310 and packet processor 320. Switch 310 can route video, data and voice packets from video, data and voice interface(s) to packet processor 320. Packet processor 320 for example, can perform packet processing such as MPEG framing, downstream scheduling, QOS, policing, filtering and rate-shaping. The packet processor 320 can include interfaces (not shown) to switch 310, IQ generator(s) (e.g. IQ generator 240a-b in FIG. 2) and modulator subsystem(s) (e.g., modulator subsystem(s) 250a-b in FIG. 2) providing configuration and control functions. In addition, packet processor 320 can implement a network management application.

After packet processing, switch 310 can route video, data and voice information from packet processor 320 to IQ generator(s) (e.g., IQ generators 240a-b of FIG. 2) through interfaces 330 or modulator subsystems (e.g., modulator subsystem 250a-b of FIG. 2) through interfaces 340. Switch 310 can also route data from IQ generator(s) and modulator subsystem(s) and/or backup interface(s) (backup interface(s) 220 in FIG. 2). The interfaces 330 and 340 between switch 310, IQ generator(s) and modulator subsystem(s) can be implemented, but not limited to a XAUI interface supporting packetized IQ data or a non-packetized interface.

Figure 4:
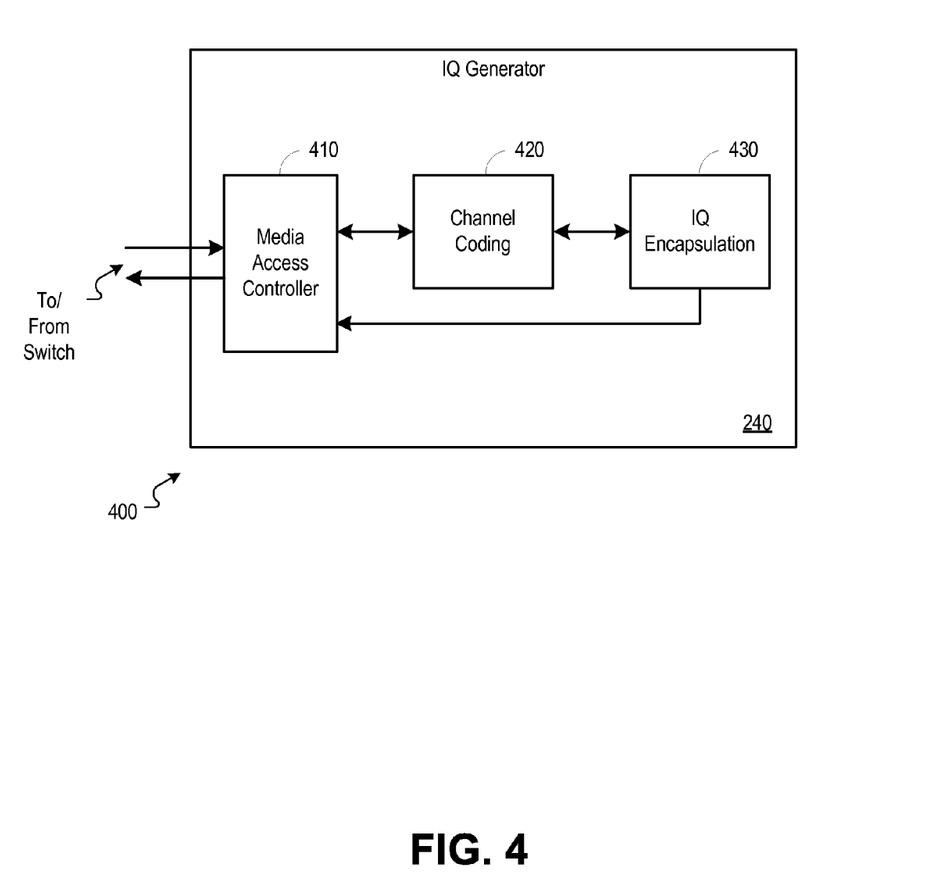
FIG. 4 is a block diagram illustrating one implementation of an IQ generator device for use in an edge modulator.

FIG. 4 is a block diagram illustrating one implementation of an IQ generator device for use in an edge modulator. The IQ generator device 240 can include media access controller 410, channel coding 420 and IQ encapsulation 430. The IQ generator 240 can receive video, data and voice information from a switch (switch 300 in FIG. 3).

The media access controller can provide control and processing for information received from and sent to the switch. Media access controller provides digital information from and to channel coding device 420.

Channel coding device 420 can be implemented to perform digital IQ channel coding including forward error correction (FEC) interleaving, convolutional encoding and symbol mapping for the access network. ITU J.83 represents one example of an access network specification for a broadband network.

The IQ digital data from the channel coding device 420 can be packetized by the IQ encapsulation device 430. Other implementations can include non-packetized IQ data (not shown). The packetized IQ data can then be sent to the switch by the media access controller 410. Media access controller 410, channel coding 420 and IQ encapsulation can be implemented as separate devices or integrated into a single device with FPGA, ASIC and/or other integrated circuit technologies.

Figure 5:
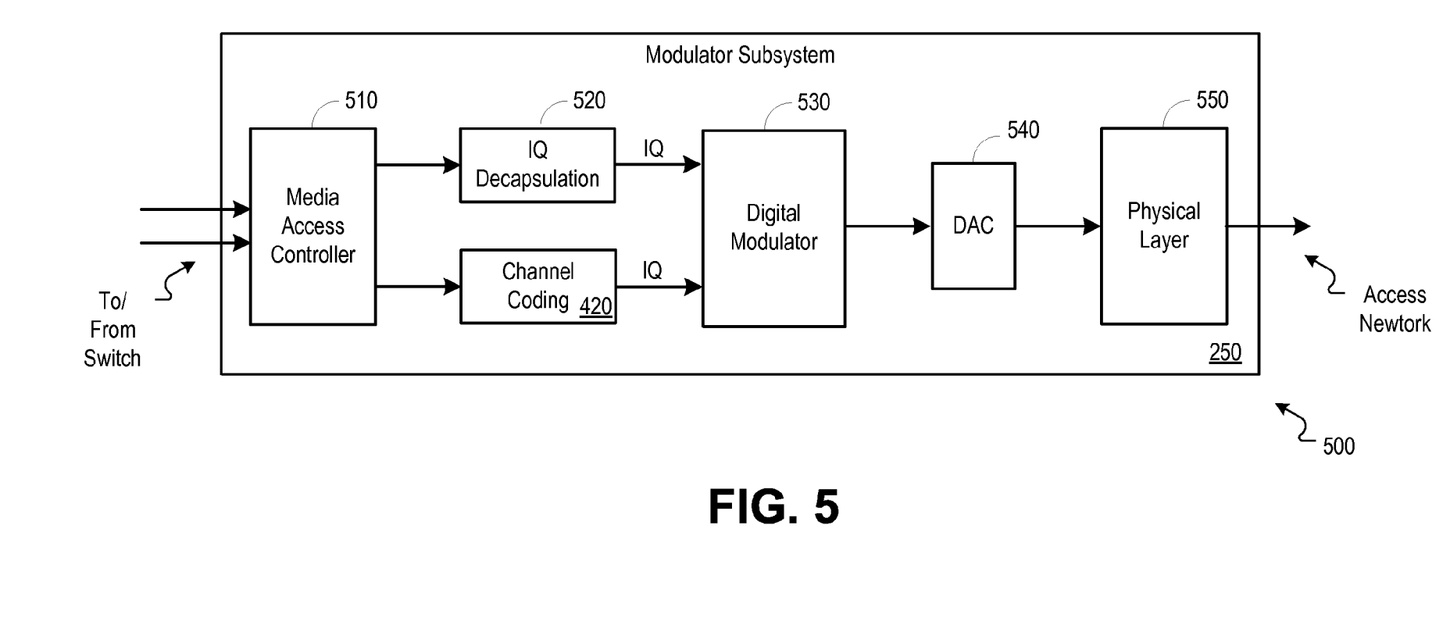
FIG. 5 is a block diagram illustrating one implementation of a modulator subsystem for use in an edge modulator.

FIG. 5 is a block diagram illustrating a modulator subsystem operable to be used in an edge modulator. Modulator subsystem 250 can include media access controller 510, IQ decapsulation 520, channel coding (e.g., channel coding 420 in FIG. 4), digital modulator 530, digital analog convertor (DAC) 540 and physical layer 550. The modulator subsystem 250 can receive video, data, voice and IQ information from the switch (e.g., switch 310 of FIG. 3).

Media access controller 510 can provide video, data and voice information to channel coding device 420 and IQ decapsulation device 520 with IQ packets generated by IQ generator(s) (e.g., IQ generator(s) 240a-b in FIG. 2). In other implementations, Media access controller 510 can provide non-packetized video, data and voice information (not shown). For packetized IQ data, the IQ decapsulation device 520 can be implemented to de-packetize the IQ data and provide IQ digital data to digital modulator 530. Digital modulator 530 can receive IQ digital data from IQ decapsulation device 520 and the channel coding device 420.

Digital modulator 530 can perform channel shaping (Nyquist filters), channel combining (two or more IQ data streams) into channel blocks. Channel blocks can be upsampled and digitally modulated with a carrier frequency and interpolated to the DAC 540 sample frequency. The digital modulator 530 can support one or more DACs (not shown). The DAC 540 can implement direct analog synthesis of the digital input provided by a digital modulator 530. The physical layer 550 supports the physical layer components of the access network. One or more physical layer device(s) 550 can be supported in various implementations with one or more DACs 540.

Figure 6:
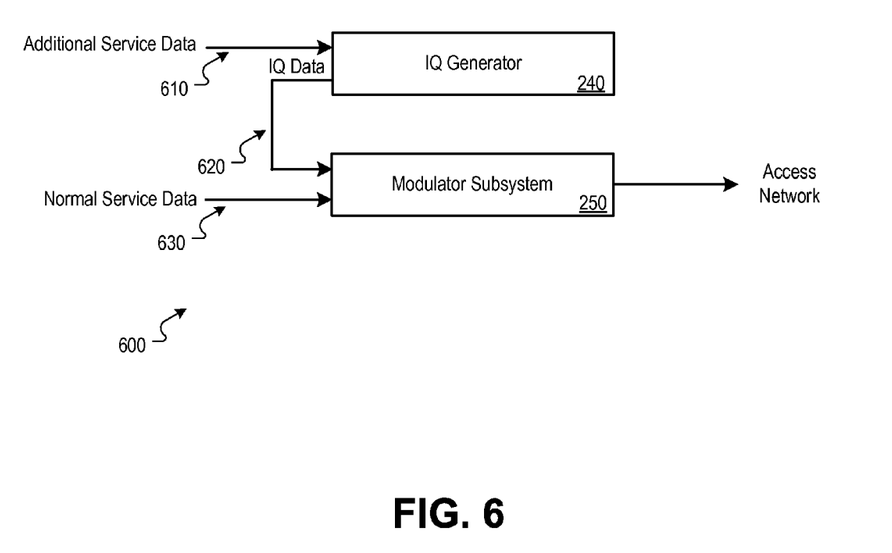
FIG. 6 is a block diagram illustrating one implementation of an edge modulator where an IQ generator can be used to increase the number of RF modulated channels.

FIG. 6 is a block diagram illustrating one implementation of an edge modulator where an IQ generator can be used to increase the number of RF modulated channels. Modulator subsystem 250 can receive video, data and/or voice information from the switch (e.g., switch 310 of FIG. 3) on interface 630. The maximum number of modulated channels provided by the modulator subsystem 250 can be limited by technology. In one implementation additional modulated channels can be provided by IQ generator 240.

IQ generator 240 can receive video, data and or voice information from the switch (e.g., switch 310 of FIG. 3) on interface 610. The IQ generator 240 can generate IQ data and send the data to modulator subsystem 250 as illustrated by connection 620. Connection 620 represents a logical connection that can be physically performed by the switch (not shown) through two interfaces.

Modulator sub-system 250 can be implemented to digitally combine the IQ data received on interface 620 with the video, data and/or voice information received on interface 630 generating additional RF modulated channels for transmission on the access network.

Figure 7:
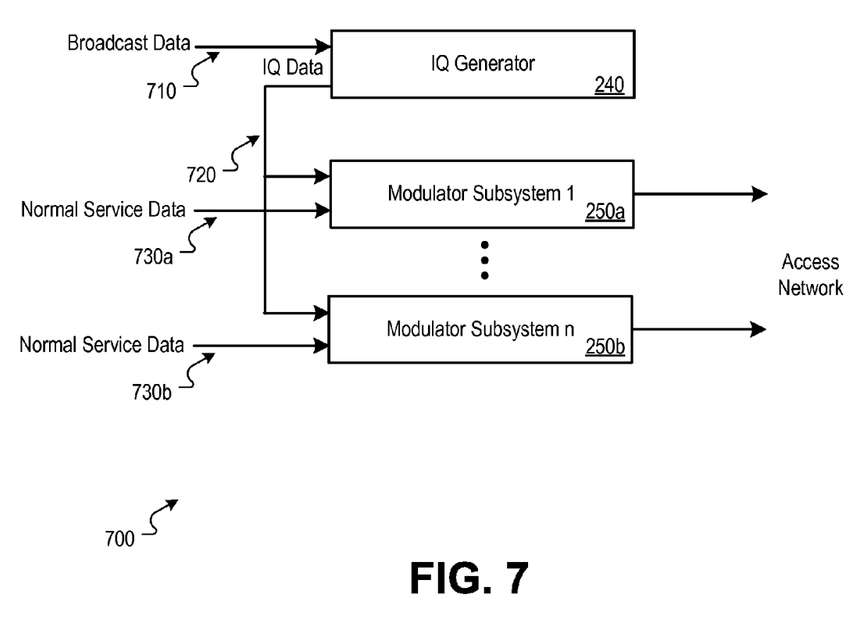
FIG. 7 is a block diagram illustrating one implementation of an edge modulator where a IQ generator can be used to generate broadcast data.

FIG. 7 is a block diagram illustrating one implementation of an edge modulator where an IQ generator can be used to generate broadcast data. Modulator subsystems 250*a-b* can receive video, data and/or voice information from the switch (e.g., switch 310 of FIG. 3) on interface(s) 730*a-b* for transmission on the access network with one or more RF outputs. In some implementations, to support broadcast transmission, the IQ generator 240 can be used to generate broadcast IQ data. Thereby, information can be broadcast in nature, for example video source(s), can require the same video source to be transmitted to one or more modulator subsystems 250*a-b* resulting in one or more RF outputs on the access network. Thereby, the implementation is optimized since the IQ generation for broadcast traffic is only performed once for one or more RF outputs.

IQ generator 240 can receive information broadcast in nature from the switch on interface 710. The IQ generator can produce IQ broadcast data on interface 720 to be routed by the switch (not shown) to one or more modulator subsystems 250*a-b* through the packet broadcast capabilities of the switch. Interface 720 is a logical representation of a connection and can be provided by three physically separate interfaces between the IQ generator 240 and the switch and between the switch and the modulator subsystems 250*a-b*.

Modulator subsystems 250*a-b* can be implemented to digitally combine the broadcast IQ data received on connection 720 with the video, data and/or voice information received on interface 730*a-b* generating RF modulated channels providing normal service and broadcast information for transmission on the access network through one or more RF outputs.

Figure 8:
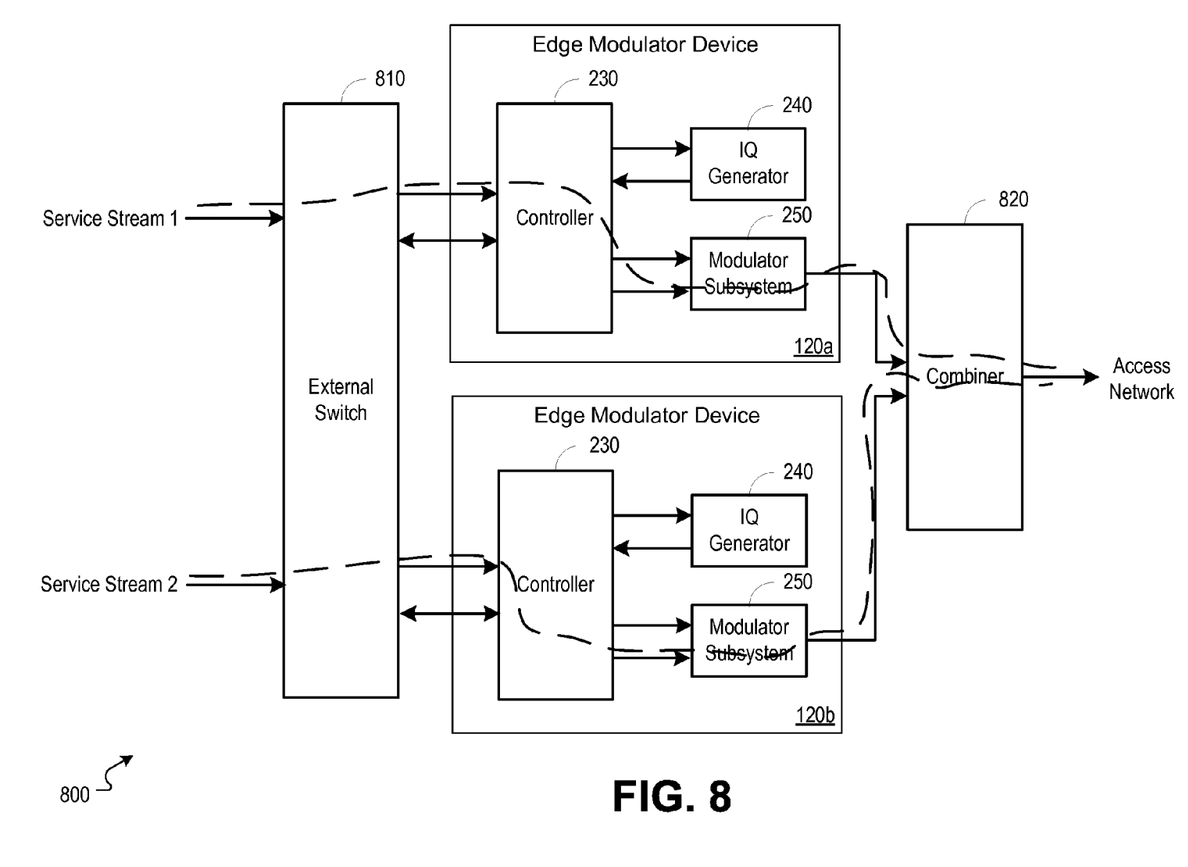
FIG. 8 is a block diagram illustrating a configuration where one or more edge modulators can provide one or more RF modulated channels.

FIG. 8 is a block diagram illustrating a configuration where one or more edge modulators can provide one or more RF modulated channels. External switch 810 can receive one or more packetized service streams for transmission on the access network. The service streams can be provided by one (not shown) or more interfaces. The external switch 810 can be a well known commercially available router and/or switch. The external switch 810 can route the packetized service stream data to the appropriate edge modulator devices 120*a-b*.

The edge modulators 120*a-b* can be implemented to receive packets through controller 230 for modulation with modulator subsystem 250 providing modulated RF outputs. Combiner 820 can be used to implement RF combining of the one or more modulated RF outputs from edge modulators 120*a-b*.

Figure 9:
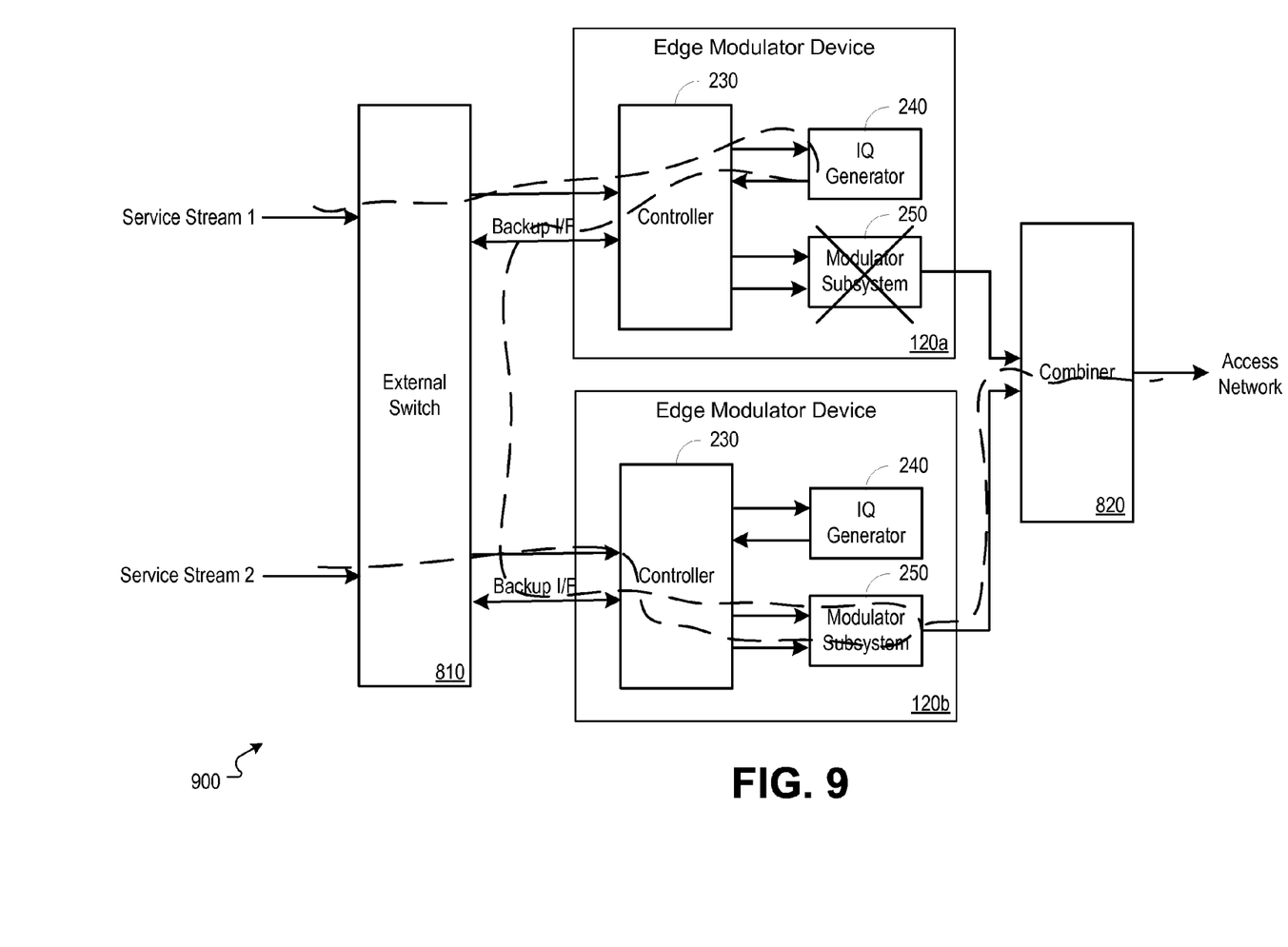
FIG. 9 is a block diagram illustrating a configuration where one or more edge modulators can continue to provide one or more RF modulated channels upon a failure.

FIG. 9 is a block diagram illustrating a configuration where one or more edge modulators can continue to provide one or more RF modulated channels upon a failure. The normal service packet data flow is illustrated by the dashed lines of FIG. 8. A service outage for service stream 1 can occur upon failure of the modulator subsystem 250 in edge modulator 120*a*. One implementation to prevent a service outage is through the use of IQ generator 240, controller 230 and external switch 810.

Upon failure detection of modulator subsystem 250 in edge modulator 120*a* the controller 230 can route the service stream 1 packet data to the IQ generator 240 in the edge modulator 120*a*. The IQ generator 240 can generate IQ data and provide the IQ data to the controller 230 in edge modulator 120*a*. Controller 230 in edge modulator 120*a* provides the packetized service stream 1 IQ data to external switch 810 through the backup interface (backup interface 220 in FIG. 2).

The external switch 810 can route the service stream 1 IQ data from edge modulator 120*a* to edge modulator 120*b* through the backup interface (e.g, backup interface 220 in FIG. 2). Modulator subsystem 250 in edge modulator 120*b* can be implemented to digitally combine the service stream 1 IQ data received on the backup interface) and the service stream 2 packetized video, data and/or voice data received from interface(s) (e.g., interface 210 in FIG. 2) by controller 230 in edge modulator 120*b*. The modulator subsystem 250 in edge modulator 120*b* can generate RF modulated channels to combiner 820 for transmission on the access network.

Figure 10:
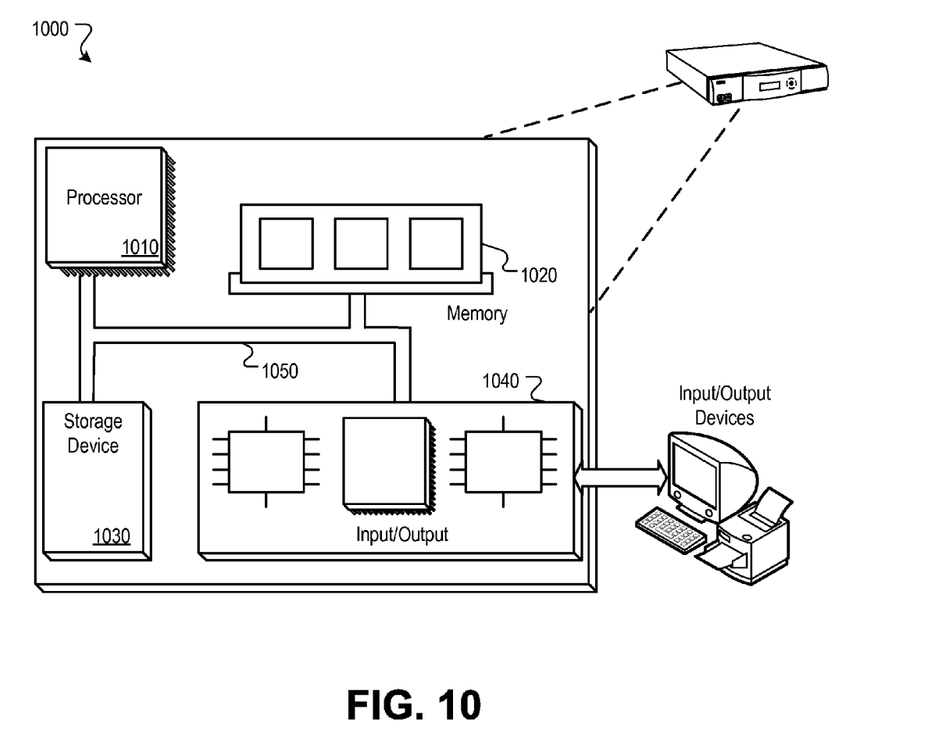
FIG. 10 is a block diagram of an example packet processor that can be used in an edge modulator device.

FIG. 10 is a block diagram of a packet processor for a packet processor (packet processor 320 in FIG. 3). The packet processor device 1000 can include a processor 1010, a memory 1020, a storage device 1030, and an input/output device 1040. Each of the components 1010, 1020, 1030, and 1040 can, for example, be interconnected using a system bus 1050. The processor 1010 is capable of processing instructions for execution within the system 1000. In one implementation, the processor 1010 is a single-threaded processor. In another implementation, the processor 1010 is a multi-threaded processor. The processor 1010 is capable of processing instructions stored in the memory 1020 or on the storage device 1030.

The memory 1020 stores information within the device 1000. In one implementation, the memory 1020 is a computer-readable medium. In one implementation, the memory 1020 is a volatile memory unit. In one implementation, the memory 1020 is a non-volatile memory unit. In another implementation, the memory 1020 can be a combination of computer-readable medium, volatile memory, and/or non-volatile memory.

In some implementations, the storage device 1030 is capable of providing mass storage for the device 1000. In one implementation, the storage device 1030 is a computer-readable medium. In various different implementations, the storage device 1030 can, for example, include a hard disk device, an optical disk device, flash memory or some other large capacity storage device.

The input/output device 1040 provides input/output operations for the device 1000. In one implementation, the input/output device 1040 can include one or more of a wireless interface, HFC network interface, such as, for example, an IP network interface device, e.g., an Ethernet card, a cellular network interface, a serial communication device, e.g., and RS-232 port, and/or a wireless interface device, e.g., and 802.11 card. In another implementation, the input/output device can include driver devices configured to receive input data and send output data to other input/output devices, as well as sending communications to, and receiving communications from various networks.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "system processor" encompasses all apparatus, devices, and machines for processing data, including by way of example a programmable processor, a computer, or multiple processors or computers. The system processor can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes described in this specification are performed by one or more programmable processors executing one or more computer programs to perform functions by operating on input data and generating output thereby tying the process to a particular machine (e.g., a machine programmed to perform the processes described herein). The processes can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors (general microprocessors being transformed into special purpose microprocessor through the application of algorithms described herein), and any one or more processors of any kind of digital computer. Generally, a processor will receive instructions and data from a read only memory, flash memory or a random access memory or all. The elements of a computer typically include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile communications device, a telephone, a cable modem, a set-top box, a mobile audio or video player, or a game console, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be operable to interface with a computing device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

What is claimed is:

1. An edge modulation system, comprising: a controller operable to receive incoming digital data streams and process the incoming digital data streams and the controller comprising a switch operable to direct the incoming digital data streams for modulation; one or more I/Q generators operable to receive the processed incoming digital data streams and to convert digital data contained within the incoming digital data streams to in-phase and quadrature components; one or more modulator subsystems operable to receive the in-phase and quadrature components from the controller and to modulate the processed incoming digital data streams for transmission over an access network, wherein the one or more modulator subsystems is further operable to digitally combine the in-phase and quadrature components with normal service data received directly from the controller; wherein the controller comprising the switch is operable to receive video, data and voice streams, the switch being operable to forward the video, data and voice streams to the one or more I/Q generators or the one or more modulator subsystems responsive to a packet processor, and wherein the switch is further operable to provide a backup interface operable to couple the edge modulation system to an external switch.

2. The edge modulation system of claim 1, wherein the backup interface facilitates providing a backup I/Q generator to a second edge modulation system upon failure of one or more components of the second edge modulation system.

3. The edge modulation system of claim 1, wherein the backup interface facilitates providing a backup I/Q generator to the edge modulation system from a second edge modulation system upon failure of one or more components of the edge modulation system.

4. The edge modulation system of claim 1, wherein the I/Q generator comprises:
an I/Q generator media access controller operable to provide control and processing for the controller for information received from or destined for the switch;
a channel coding module operable to receive data from the I/Q generator media access controller, perform digital I/Q channel coding for the access network; and
an I/Q encapsulation device operable to packetize I/Q digital data received from the channel coding module.

5. The edge modulation system of claim 4, wherein the one or more modulator subsystems comprise: a modulator media access controller operable to provide non-packetized video, data and voice information to a modulator channel coding module and packetized I/Q data to a modulator I/Q decapsulation module; the modulator I/Q decapsulation module operable to de-packetize the I/Q data and provide I/Q digital data to a digital modulator; the modulator channel coding module operable to receive data from the modulator media access controller and to perform digital I/Q channel coding on the data and provide digital I/Q channel coded data; the digital modulator operable to receive the I/Q digital data from the modulator I/Q decapsulation module or the digital I/Q channel coded data from the modulator channel coding module and to perform channel shaping, and combine channels into channel blocks to produce an output, the digital modulator is also operable to upsample the channel blocks and digitally modulate the I/Q digital data with a carrier frequency and interpolate the modulated data to a sample frequency; and a digital analog converter operable to sample at the sample frequency operable to provide a direct analog synthesis of the output of the digital modulator for output to a physical layer.

6. A non-transitory computer-implemented method, comprising: receiving incoming digital data streams at a controller; directing the incoming digital data streams from a switch in the controller to one of one or more modulator subsystems or one or more I/Q generators, wherein directing comprises using the switch to forward video, data and voice streams to the one or more I/Q generators or the one of one or more modulator subsystems responsive to a packet processor; converting digital data contained within the incoming data streams to in-phase and quadrature components at the one or more I/Q generators; receiving the in-phase and quadrature components from the controller and the one or more I/Q generators at the one or more modulator subsystems; digitally combining the in-phase and quadrature components with normal service data received directly from the controller at the one or more modulator subsystems; and modulating at the one or more modulator subsystems the digitally combined in-phase and quadrature components for transmission over an access network, and providing a backup interface operable at the switch to couple an edge modulation system to an external switch.

7. The method of claim 6, wherein the backup interface facilitates providing a backup I/Q generator to a second edge modulation system upon failure of one or more components of a system used in the method.

8. A non-transitory computer-implemented method, comprising: receiving incoming digital data streams at a controller; directing the incoming digital data streams from a switch in the controller to one of one or more modulator subsystems or one or more I/Q generators; converting digital data contained within the incoming data streams to in-phase and quadrature components at the one or more I/Q generators; receiving the in-phase and quadrature components from the controller and the one or more I/Q generators at the one or more modulator subsystems; digitally combining the in-phase and quadrature components with normal service data received directly from the controller at the one or more modulator subsystems; and modulating at the one or more modulator subsystems the digitally combined in-phase and quadrature components for transmission over an access network; wherein the one or more I/Q generators are operable to provide an I/Q generator media access controller operable to provide control and processing for information received from or destined for the switch, a channel coding module operable to receive data from the I/Q generator media access controller, perform digital I/Q channel coding on the data and provide convolutional encoding and symbol mapping for the access network, and an I/Q encapsulation device operable to packetize I/Q digital data received from the channel coding module.

9. The method of claim 8, wherein the one of the one or more modulator subsystems are operable to provide a modulator media access controller operable to provide non-packetized video, data and voice information to a modulator channel coding module and packetized I/Q data to a modulator I/Q decapsulation module, wherein the modulator I/Q decapsulation module operable to de-packetize the I/Q data and provide I/Q digital data to digital modulator, the modulator channel coding module operable to receive data from the modulator media access controller and to perform digital I/Q channel coding on the data and provide digital I/Q channel coded data, the digital modulator operable to receive the I/Q digital data from the I/Q decapsulation module or the digital I/Q channel coded data from the modulator channel coding module and to perform channel shaping, and combine channels into channel blocks to produce an output, the digital modulator is also operable to upsample the channel blocks and digitally modulate the I/Q digital data with a carrier frequency and interpolate the modulated data to a sample frequency, and a digital analog convertor operable to sample at the sample frequency operable to provide a direct analog synthesis of the output of the digital modulator for output to a physical layer.

* * * * *